(12) United States Patent
Liu et al.

(10) Patent No.: US 6,455,898 B1
(45) Date of Patent: Sep. 24, 2002

(54) ELECTROSTATIC DISCHARGE INPUT PROTECTION FOR REDUCING INPUT RESISTANCE

(75) Inventors: Meng-Hwang Liu, Tainan; Tao-Cheng Lu, Kaohsiung; Mam-Tsung Wang, Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/267,303

(22) Filed: Mar. 15, 1999

(51) Int. Cl.$^7$ .............................................. H01L 23/62
(52) U.S. Cl. ........................ 257/360; 257/355; 257/357
(58) Field of Search ................................. 257/355, 356, 257/357, 360

(56) References Cited

U.S. PATENT DOCUMENTS

| | | | |
|---|---|---|---|
| 4,789,917 A | * 12/1988 | Miller | 361/56 |
| 4,996,626 A | * 2/1991 | Say | 361/56 |
| 5,731,614 A | * 3/1998 | Ham | 257/355 |
| 5,739,571 A | * 4/1998 | Kurachi | 257/360 |
| 5,760,446 A | * 6/1998 | Yang et al. | 257/357 |
| 5,869,873 A | * 2/1999 | Yu | 257/362 |
| 5,905,288 A | * 5/1999 | Ker | 257/355 |
| 5,910,677 A | 6/1999 | Irino | 257/393 |
| 6,137,338 A | * 10/2000 | Marum et al. | 327/318 |

FOREIGN PATENT DOCUMENTS

| | | |
|---|---|---|
| JP | 07038059 A | 2/1995 |
| JP | 07066370 A | 3/1995 |
| JP | 10-189958 | 7/1998 |

OTHER PUBLICATIONS

T.V. Hulett, "On–Chip Protection of High Density NMOS Devices," EOS/ESD Symp. Proc., vol. EOS–3, 1981, pp. 90–96.
J.K. Keller, "Protection of MOS Integrated Circuits from Destruction by Electrostatic Discharge," 1 EOS/ESD Symp. Proc., vol. EOS–2, 1980, pp. 73–80.
C. Duvvury, R.N. Rountree and L.S. White, "A Summary of Most Effective Electrostatic Discharge Protection Circuits for MOS Memories and their Observed Failure Modes," EOS/ESD Symp. Proc., vol. EOS–5 1983, pp. 181–184.

* cited by examiner

Primary Examiner—George C. Eckert, II
(74) Attorney, Agent, or Firm—Mark A. Haynes; Haynes Beffel & Wolfeld LLP

(57) ABSTRACT

An ESD protection structure for protecting an internal circuit comprising a primary protection device, a secondary protection device, and a substrate pickup is presented. The primary protection device and secondary protection device share a common source, and this common source implementation lowers the trigger voltage of the primary protection device to be about the same as the trigger voltage of the secondary protection device, thereby eliminating the need to use an isolation resistor between the primary and secondary protection devices.

11 Claims, 7 Drawing Sheets

ELECTROSTATIC DISCHARGE INPUT PROTECTION FOR REDUCING INPUT RESISTANCE

BACKGROUND OF THE INVENTION

1. Filed of the Invention

The field of the present invention relates to electrostatic discharge protection circuits; and in particular to an electrostatic discharge ("ESD") protection circuit with enhanced input protection performance employing a reduction in an input isolation resistor.

2. Description of Related Art

ESD results when an electrostatic charge is dissipated either to another object or to ground rapidly, resulting in a high voltage pulse. In an integrated circuit (IC) environment, equipment and personnel can acquire substantial amounts of electrostatic charge that can subsequently be transferred to an integrated circuit during manufacturing or during usage. The human body, for example, can accumulate charges exceeding 2000V, which if discharged to the IC could cause damage to it.

Damage to a device during an ESD event is determined by the device's inability to dissipate the energy of the discharge by withstanding the voltage levels involved. This is known as the device's "ESD sensitivity." Many electronic components are susceptible to ESD damage even at relatively low voltage levels.

As integrated circuit devices become smaller, ESD damage is more likely to occur because of the devices inability to safely dissipate the discharge. When an electronic device experiences an ESD, it may no longer function because the discharge may have caused for example one or more of a metal melt down, a junction breakdown, and an oxide failure. If the device does not fail after encountering an ESD, the exposure may result in a degradation the device. The degradation may involve impairment of the devices's functions or a decrease in the device's operating life.

Conventional approaches to the ESD problem have been to provide the protected circuit with devices that can intervene to shunt ESD charges to ground. Two-stage protection comprising a primary protection device and a secondary protection device, as shown in FIG. 1, is the conventional input protection scheme. In a conventional scheme the primary protection device will shunt most or all of the current during ESD, while the secondary element functions to limit the voltage or current seen by the protected circuit until the primary device is fully operational. The trigger voltage of the secondary protection device is generally lower than the trigger voltage of the primary protection device. For example, FIG. 7(A) depicts an I-V curve of such a conventional two-stage protection device. The trigger voltage Vtr2 of the secondary protection device is shown to be about 8.6V in the figure. After the operational voltage reaches the trigger voltage of the secondary protection device, the ESD current flows through the isolation resistor between the primary and secondary protection devices. The voltage drop (I×R) increases the pad voltage, as depicted by the linear I-V region LR after the 8.6V level of FIG. 7(A). When the pad voltage increases to approximately 13.4V, which is the trigger voltage of the primary protection device, the primary protection device is triggered to discharge the ESD current, reaching a peak current P in the graph.

In a conventional scheme, the trigger voltage of the protection device is fixed. In order for the primary protection device be triggered as soon as possible, a large isolation resistor is required to increase the pad voltage faster during an ESD event. For performance enhancement of the input protection, this isolation resistor has a low limit on the order of 100 to 150 ohms, depending on the process. The isolation resistor becomes the input resistor to the internal circuit of the IC and reduces the speed of the internal circuit. The effect of the isolation resistor is especially pronounced for high-speed integrated circuits.

Therefore, it is desirable to produce a new scheme to reduce the input resistance without sacrificing the performance of the protection circuit.

SUMMARY OF THE INVENTION

In the present invention, a new apparatus and method to reduce the input resistance of an ESD protection circuit is presented. An ESD protection circuit, comprising a primary protection device, a secondary protection device, and a pickup node, is connected between an input pad and an internal circuit for protecting an internal circuit from being damaged by an ESD current. The new apparatus and method is directed to reducing the trigger voltage of the primary protection device by implementing primary and secondary protection devices which share a common source region. The primary protection device comprises a drain, a source, a channel region between the source and the drain, and a gate structure (in some embodiments, no conductive gate is needed) over the channel region in a semiconductor body. The secondary protection device comprises a gate, a channel, a drain, and shares its source with the primary protection device.

The secondary protection device also has gate structure on top of the channel region between its drain and the shared source. The gates of the primary and secondary protection devices are connected to the common source region and to ground. The drain regions of both the primary and secondary protection devices are connected to the protected terminal (s). In addition, there is a substrate pickup within the protection structure, comprising diffused or implanted materials of the same conductivity type as the surrounding semiconductor body. In the preferred embodiment, the substrate pickup is disposed next to the secondary protection device rather than the primary protection device.

A variety of devices, including, but not limited to, thin-gate NMOS devices, can serve as primary and secondary protection devices. In one embodiment, the primary protection device comprises field-oxide device and the secondary protection device comprises a grounded-gate NMOS (GGNMOS). In another embodiment, the primary protection device comprises a thin-gate NMOS with the gate length longer than that of the secondary protection device, which also comprises a thin-gate NMOS. In yet another embodiment, the primary protection device comprises the low-voltage SCR and the secondary protection device comprises a NMOS. In yet another embodiment, the primary protection device comprises the low-voltage SCR and the secondary protection device comprises a diode.

The present invention is applicable to, but is not limited to, output pads and power pads. However, because of the large area involved for the two-stage protection structure, the protected terminals most commonly comprise input pads.

In summary, under the common source implementation, the trigger voltage of the primary protection device will be lowered significantly; it may be substantially equal to the trigger voltage of the secondary protection device. As the trigger voltage of the primary protection device decreases, the resistance of the isolation resistor can be reduced accordingly and theoretically to zero, thus eliminating the need for an isolation resistor, which interferes with the performance of the protected circuit.

Additional features and advantages of the invention will be set forth in the detailed description which follows, and in part will be apparent from the description, or may be learned by practice of the invention. The aspects and other advantages of the invention will be realized and attained by the structure particularly pointed out in the written description and claims hereof as well as the appended drawings.

To achieve these and other advantages and in accordance with the purpose of the present invention, as embodied and broadly described, the present invention can be characterized according to one aspect as an electrostatic discharge (ESD) protection circuit for protecting terminals of an integrated circuit on a semiconductor body, including a primary protection device formed in said semiconductor body, a secondary protection device formed in said semiconductor body, wherein the primary protection device and the secondary protection device share a diffusion region, and a grounded pickup region adjacent to one of the primary and the secondary protection devices.

Another aspect of the present invention can be characterized as a method for making an electrostatic protection circuit, having a reduced isolation resistance, for protecting an integrated circuit, the method including the steps of forming a primary protection device in a semiconductor body, forming a secondary protection device in a semiconductor body, wherein the primary protection device and the secondary protection device share a diffusion region, and forming a grounded pickup region adjacent to one of the primary and the secondary protection devices.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

The present invention will now be described in detail with references to the accompanying figures. It is to be noted that the following description of preferred embodiments of this invention are presented herein for purpose of illustration and description only. The invention is not intended to be limited to the precise form disclosed.

Figure 1:
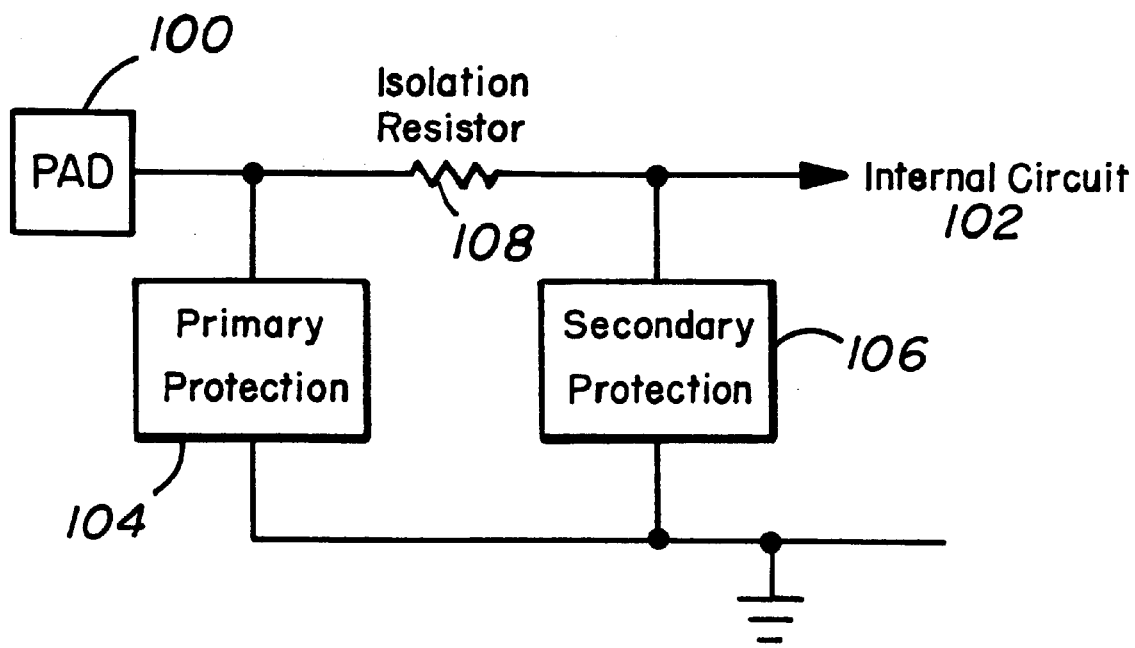
FIG. 1 is a simplified schematic of a prior art two-stage ESD protection circuit.
Figure 2:
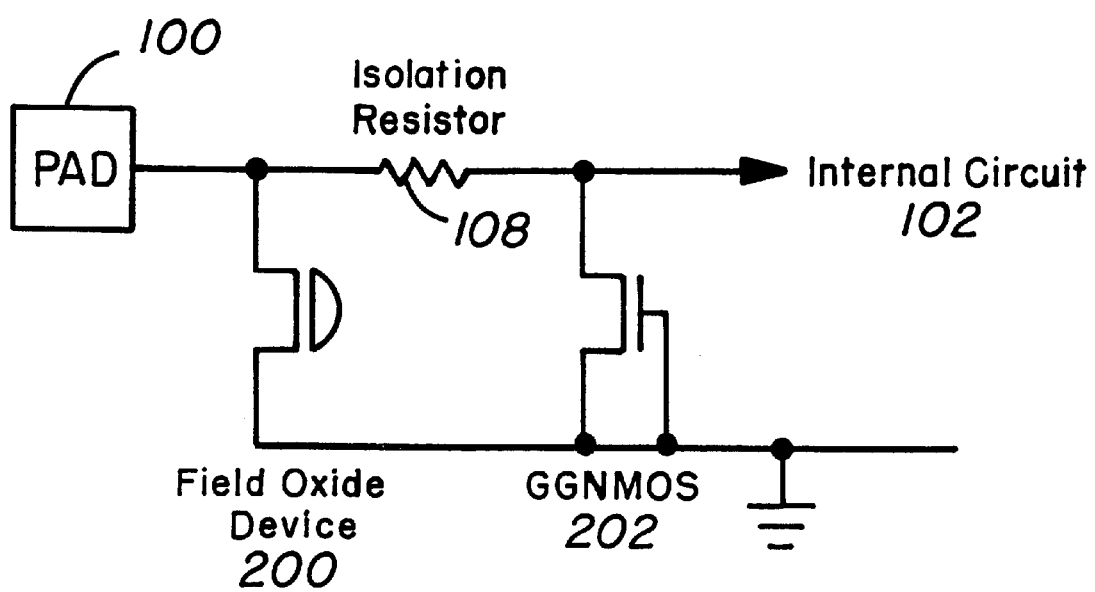
FIG. 2 is a schematic of a prior art two-stage ESD protection circuit with field-oxide device as the primary protection device and grounded-gate NMOS as the secondary protection device.

FIG. 1 is a conventional two-stage protection structure situated between a conductive pad 100 and the protected circuit 102; the protection structure comprising a primary protection device 104 connected to the secondary protection device 106 through an isolation resistor 108. Commonly, a field-oxide device 200 is used as the primary protection device, and a grounded-gate NMOS (GGNMOS) 202 is used as the secondary protection device, as shown in FIG. 2.

Figure 7A:
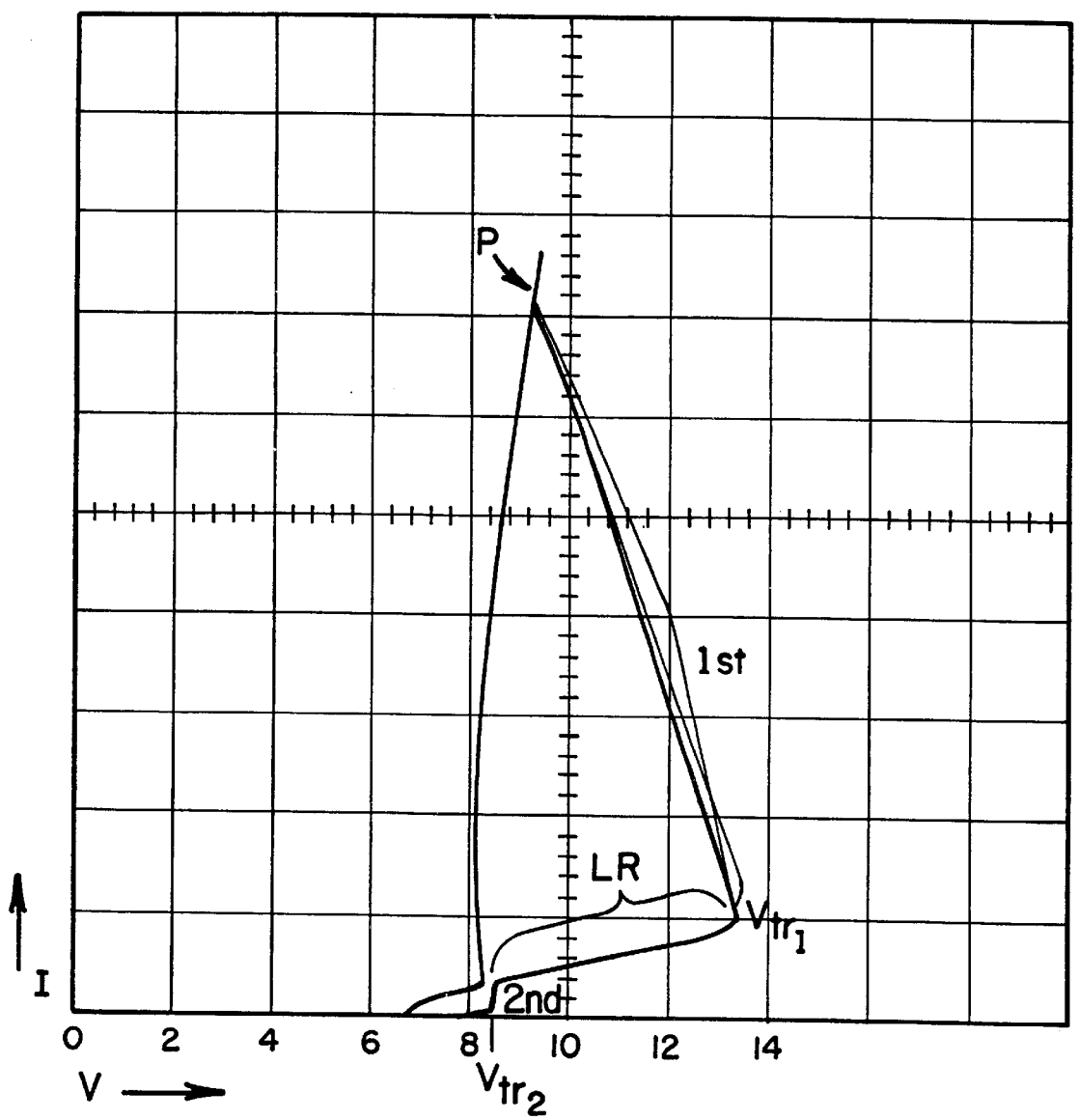
FIG. 7(A) shows measured I-V curves of prior art protection circuit of FIG. 2.

The secondary protection device 106 in the conventional structure will have a lower trigger voltage Vtr2 than that Vtr1 of the primary protection device 104. For example FIG. 7(A) depicts an I-V curve of the conventional protection device shown FIG. 2. FIG. 7(A) illustrates that the trigger voltage of the GGNMOS 202, which is serving as the secondary protection device, is approximately 8.6V. This voltage is labeled as Vtr2 in FIG. 7(A). After reaching its triggering voltage, the GGNMOS 202 will turn on and the ESD current will flow through the isolation resistor 108. A voltage, which is equal to the product of the ESD current and the resistance of the resistor 108, will build up the pad voltage. This build-up phase is represented in the linear I-V region LR after 8.6V.

The graph of FIG. 7(A) illustrates that when the pad voltage exceeds approximately 13.4V, which is the trigger voltage of the field-oxide device 200 serving as the primary protection device, it is turned on. This point is labeled as Vtr1 in FIG. 7(A). After the pad voltage exceeds the 13.4V threshold the primary protection device is triggered into a snapback mode to discharge ESD current. Therefore, in the conventional two-stage scheme, a large isolation resistor 108 is required to increase the pad voltage at lower current levels to promote the primary protection device to turn on faster. Isolation resistor 108 is usually within the range of 100 to 150 ohm. The isolation resistor is also an input resistance to the internal circuit 102 of the IC. An input resistance on the order of 100 to 150 ohms will have a significant impact on the speed of the internal circuit 102, especially for high-speed integrated circuits.

In the present invention, a new apparatus and method for reducing the need for isolation resistor 108 is presented. One central concept of this invention is to reduce the trigger voltage the primary protection device 104 by implementing a common source diffusion region to be shared by the primary protection device 104 and secondary protection device 106. Various devices can serve as primary protection device 104 and secondary protection device 106.

Figure 3:
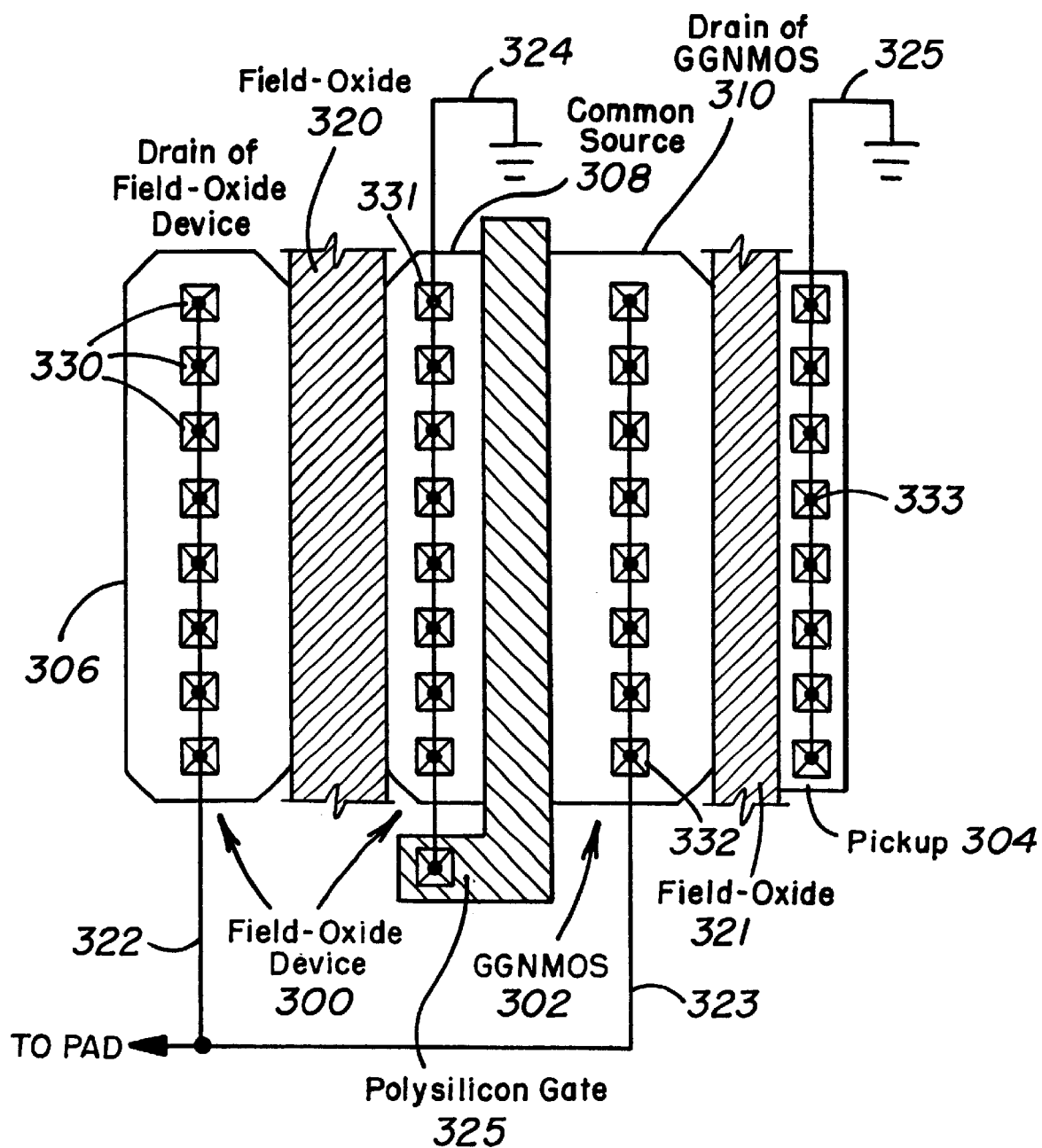
FIG. 3 is a layout of the common-source implementation of a ESD protection circuits comprising field-oxide devices as the primary protection device and grounded-gate NMOS as the secondary protection device of the present invention.

FIG. 3 illustrates the layout of a possible implementation of the scheme using fieldoxide device 300 as the primary protection device, and GGNMOS 302 as the secondary protection device. The field-oxide device 300 and GGNMOS 302 have separate drain regions, 306 and 310 respectively. However, they share a common source region 308. The field oxide device 300 comprises the drain diffusion region 306, the source diffusion region 308, and the field oxide region 320. The field oxide region comprises a relatively thick oxide structure, such as structures formed for example by a so-called LOCOS process. Other oxide structures can be utilized as well. Contacts to the diffusion regions are made through substrate to metal contacts, e.g. 330, in the drain diffusion region, and substrate to metal contacts, e.g. 331, in the source diffusion region. The metal connections are shown schematically by metal line 322 coupled to the contacts, e.g. 330, in the drain diffusion region 306 and to the pad, and metal line 324 connected to the contacts, e.g. 331, in the source diffusion region 308 and to ground.

The secondary protection device in this example is a grounded gate n-channel MOS transistor, comprising the source diffusion region 308, the drain diffusion region 310, a polysilicon gate 325 formed over a channel region between this source 308 and drain 310. A thin oxide, such as 100 to 200 Angstroms thick, is formed under the gate 325 as known in the art. Metal line 323 is coupled to the diffusion to metal contacts, e.g. 332, in the drain diffusion region 310 of the secondary protection device 302 and to the pad. Metal line 325 is connected to the diffusion to metal contacts, e.g. 333, in the pickup diffusion region 304, and to ground. The polysilicon gate 325 is also connected to metal line 324, establishing a grounded gate. The grounded gate n-channel MOS transistor 302 is therefore connected in a diode configuration.

In order to make the invention perform more effectively, the substrate pickup 304 is placed adjacent to one of the protection devices. The pickup represents the semiconductor body contact. In a preferred embodiment, the pickup 304 is placed adjacent to the secondary protection device 302, away from the primary protection device 300. This preferred arrangement is shown in FIG. 3. This preferred arrangement will help promote the building of a high source/substrate potential more efficiently so as to induce the triggering of the primary protection device 300.

Figure 4:
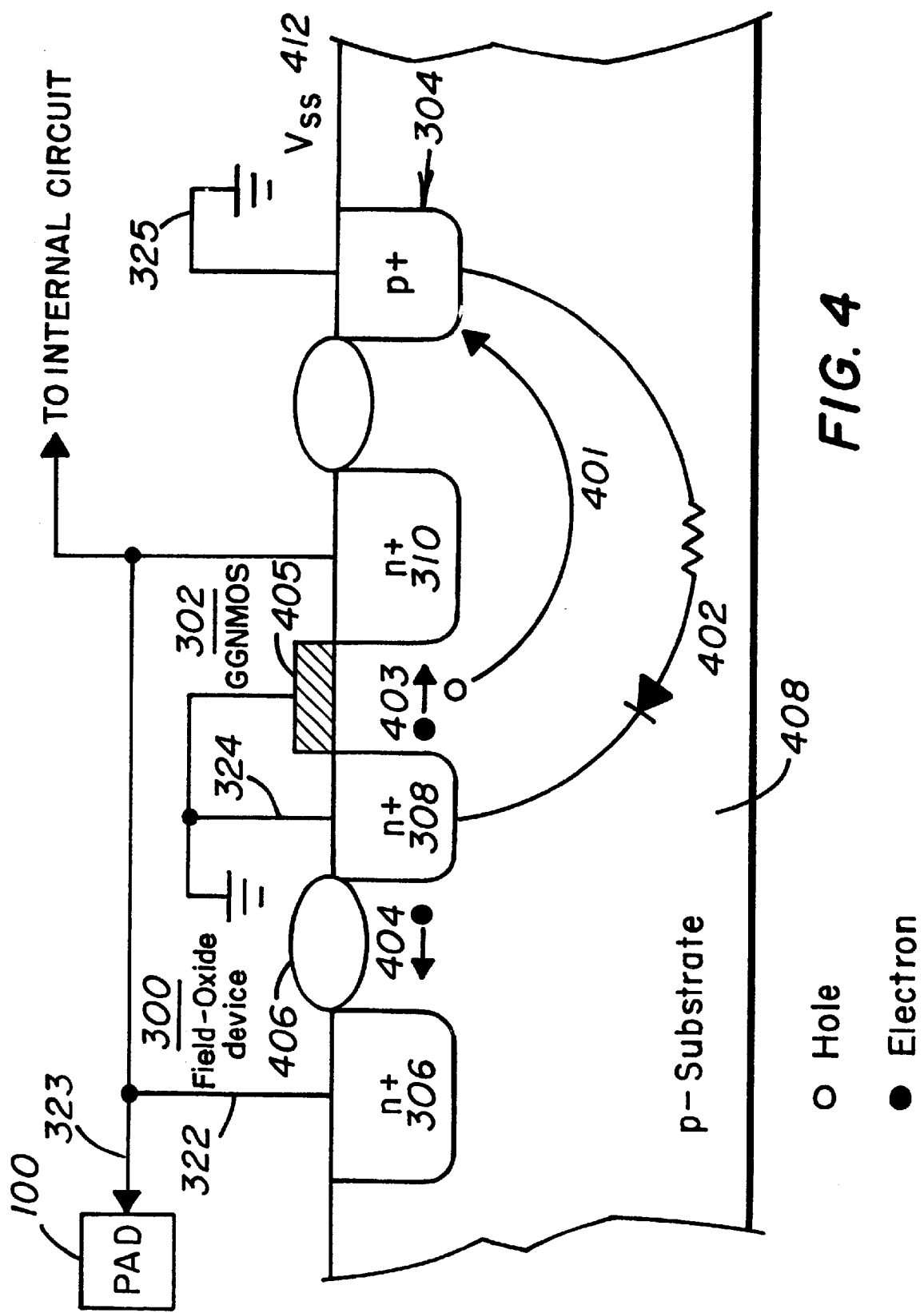
FIG. 4 is a cross-sectional view illustrating one embodiment of the present invention using field-oxide device as the primary protection device and grounded-gate NMOS as the secondary protection device.

FIG. 4 illustrates the structure of the implementation of FIG. 3 in cross-section and the underlying workings of the invention by the movements of holes and the electrons can be understood with reference to this FIG. 4. FIG. 4 shows the operation of the present invention under a polarity state in which the voltage on line 323 is floating and the second supply voltage Vss 412 is ground. When the pad 100 reaches the avalanche breakdown voltage of the drain junction 310 of the GGNMOS 302, electrons and holes are generated near the drain junction 310. The generated holes contributing to the substrate current will be collected by the substrate pickup 304; this is represented as current path 401 in FIG. 4. The hole current causes a voltage drop in the substrate material 408 on the order of 0.6V, causing the substrate-source junction to be forward biased and conduct heavily; this is represented as current path 402, which includes heuristic symbols for a resistor and a diode, as shown in FIG. 4. Electrons at this voltage will be injected from the source 308 to substrate 408. The injected electrons form two current paths: current path 404 toward the drain junction 306 of the field-oxide device 300 and a current path 403 toward the drain junction 310 of the GGNMOS 302. The drain junction 306 of the field-oxide device 300 will already be at a high voltage due to the direct connection to pad 100 experiencing ESD stress. The electron current 406 directed towards the drain 306 of the primary protection device 300 will significantly lower the trigger voltage of the oxide device 300.

Therefore, it will not be necessary to implement an isolation resistor between the primary protection device 300 and the secondary protection device 302 to build up a voltage drop across a resistor. The elimination of the isolation resistor in the two-stage protection structure will lead to higher operation (or reduction) speeds for the integrated circuit without sacrificing adequate ESD protection for the circuit.

Figure 7B:
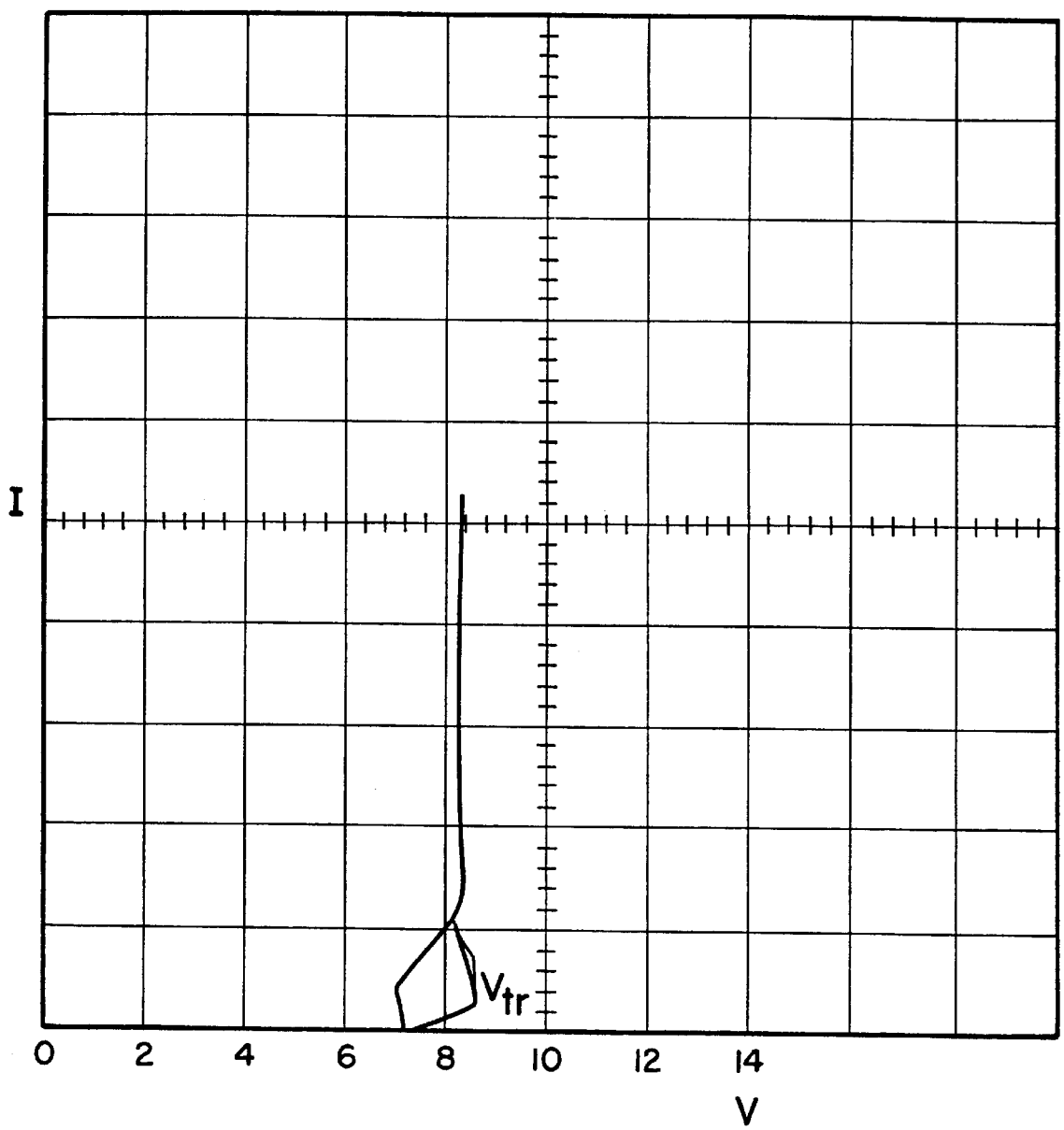
FIG. 7(B) shows the measured I-V curve for common source implementation of this invention.

FIG. 7(B) is the measured I-V curve for the common source implementation of FIG. 4. In contrast to FIG. 7(A), the primary and secondary protection devices are observed to have approximately the same trigger voltage at 8.6V, labeled "Vtr" in FIG. 7(B). To the extent that the trigger voltages are not identical an isolation resistor of small resistance value may be needed.

Figure 5A:
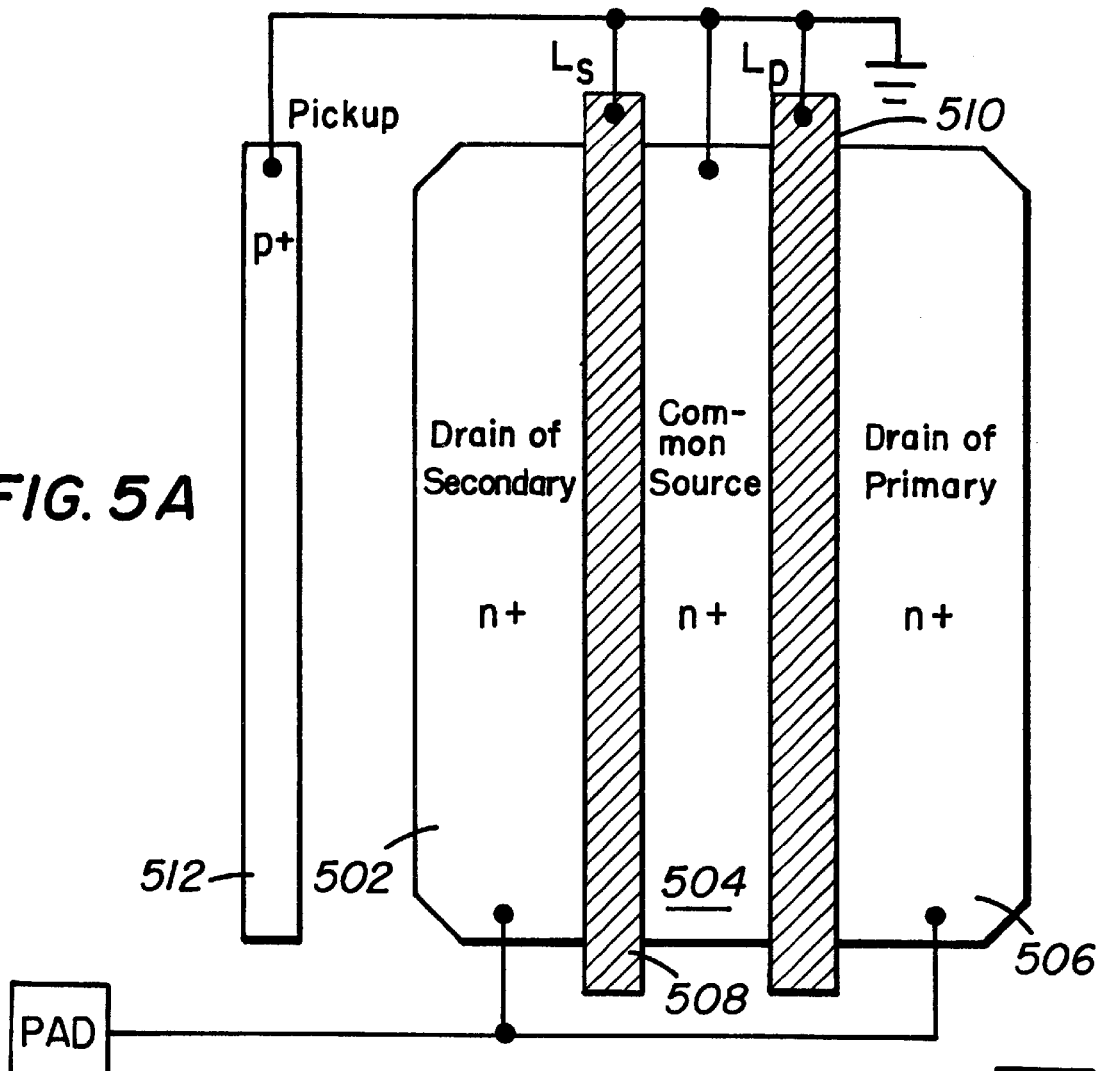
FIG. 5(A) is a layout of one embodiment of the present invention using a thin-gate NMOS as the primary and secondary protection device.
Figure 5B:
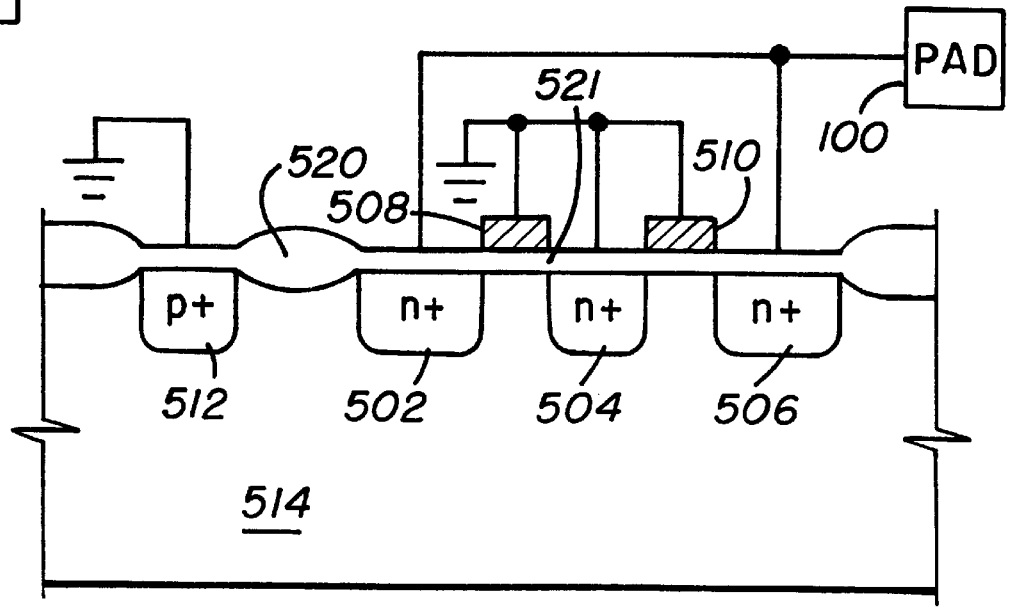
FIG. 5(B) is a cross-sectional view of the embodiment of FIG. 5(A) of the present invention.

The common source scheme of this invention can be implemented by different devices, and FIG. 5(A) and 5(B) and FIG. 6(A) and 6(B) are some examples. In FIGS. 5(A) and 5(B) the primary protection device and the secondary protection device are both thin-gate NMOS. Thus, the primary protection device includes diffusion region 506 and common source diffusion region 504. The polysilicon gate structure 510 is formed over a channel between the source region 504 and drain region 506. The channel has a length Lp extending from the drain region 506 to the source region 504. The secondary protection device includes drain diffusion region 502 and a source diffusion region 504. They polysilicon gate structure 508 is formed between the drain region 502 and source region 504. The channel region has a length Ls, which is less than the length Lp of the channel of the primary protection device.

FIG. 5(B) illustrates the structure of FIG. 5(A) in cross-section. The field oxide region 520 between the pickup 512 and the drain region 502 is illustrated as a thick oxide region. Thin oxide beneath the gate 508 and gate 510 is illustrated in region 521. The diffusion regions 502, 504, and 506 are n-type diffusion regions in a p-type substrate 514. The drains 502 and 506 of the primary and secondary protection devices are connected together and coupled to the pad 100. The common source 504 is connected to the gates 508 and 510 of the protection devices and grounded. A substrate pickup 512 is grounded and is of the same conductivity as the substrate 514. In order for the invention to function properly, it is preferred that the length of the channel region under gate 510 of the primary protection device be longer than the length of the channel region under gate 508 of the secondary protection device, or that the devices are implemented otherwise to ensure that the secondary device reaches snap back first.

Figures 6A, 6B:
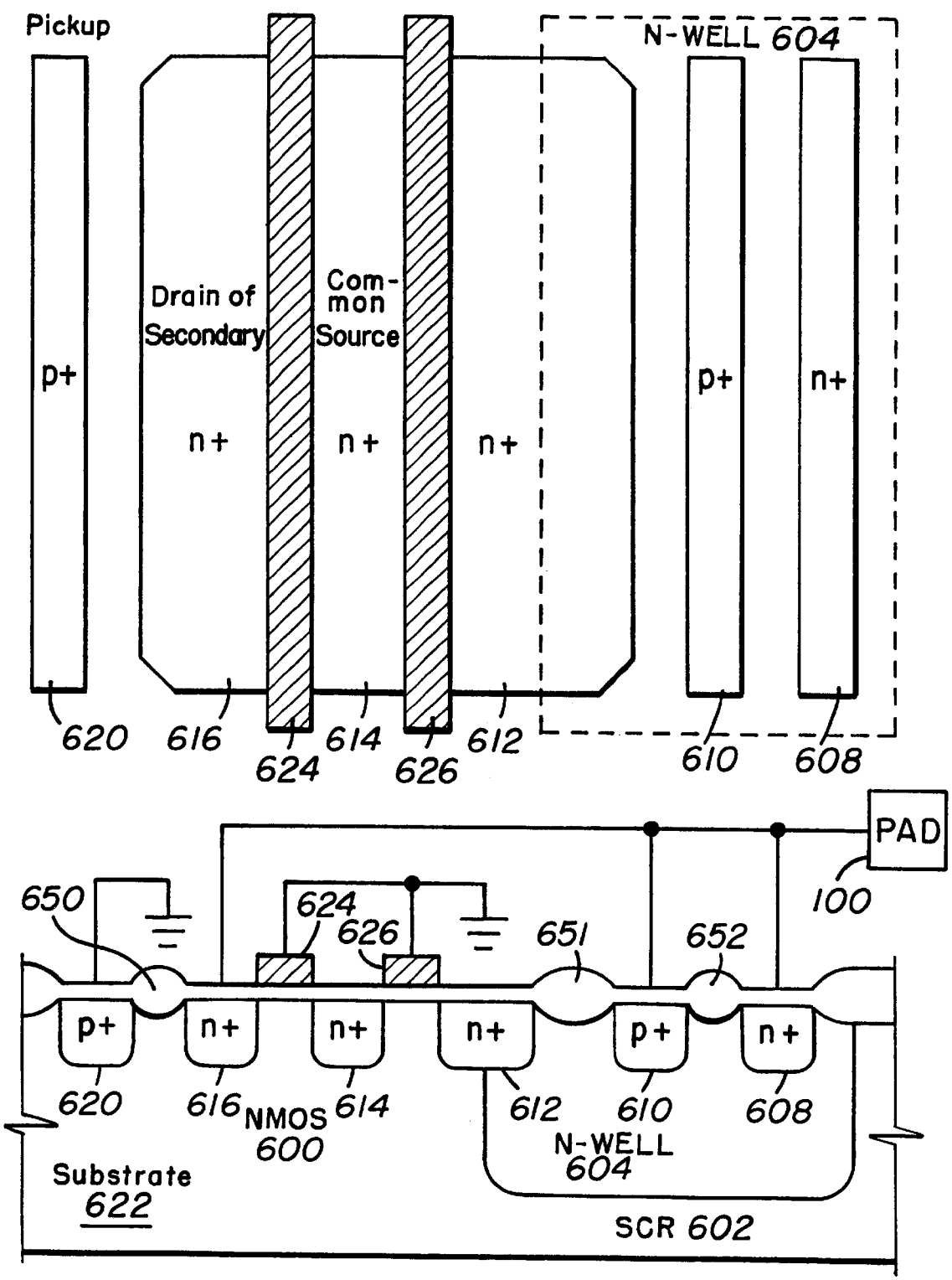
FIG. 6(A) is a layout of one embodiment of this invention using low-voltage triggering SCR as the primary protection device and grounded-gate NMOS as the secondary protection device.
FIG. 6(B) is a cross-sectional of the embodiment of FIG. 6(A) of the present invention.

In FIGS. 6(A) and 6(B), the primary protection device is implemented by SCR 602 and the secondary protection device is implemented by thin-gate NMOS 600. An SCR (silicon controlled rectifier) is one of the most efficient of all protection devices in terms of ESD performance per unit area. The basic SCR 602 is a p-n-p-n device. FIG. 6 (A) illustrates a layout of an implementation using an SCR. The pickup diffusion region 620 is formed adjacent the drain 616 of the secondary protection device. A field oxide region is formed between the pickup 620 and the drain 616. A gate structure 624 is formed over a thin oxide over a channel region between the source region 614 and the drain region 616. Source region 614 is shared with the SCR. A gate structure 626 is formed over a thin oxide over a channel region for the SCR. Diffusion region 612 is formed adjacent gate structure 626. The n-type well 604 is formed adjacent the diffusion region 612. P-type diffusion 610 is formed in the n-well 604. Also n-type diffusion region 608 is formed in the n-well 604.

FIG. 6 (B) shows the SCR based device in cross-section. As can be seen field oxide regions 650, 651 and 652 are formed between the pickup region 620 and the drain diffusion region 616, between the n-type region 612 and the p-type region 610, an between the p-type region 610 and the n-type region 608. Thin oxide is formed under the gate structures 624 and 626. The diffusion 616, diffusion 610 and diffusion 608 are connected to the pad 100. The gate structures 624 and 626 are connected to ground.

The present invention is particularly suited for protection of input pads. It can also be used for output pads, input/output pads, and power pads as suits the particular implementation. Output buffers are typically relatively large, and the two stage protection structure of the present invention may not be desirable. The present invention lowers the triggering voltage of the primary protection device using the shared source diffusion region, and eliminates or reduces the need for isolation resistance. Thus the input resistance on input pads can be as small as possible, enhancing the speed of the circuit.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An electrostatic discharge (ESD) protection circuit for protecting a terminal of an integrated circuit on a semiconductor body, comprising:

a primary protection device formed in said semiconductor body;

a secondary protection device comprising a thin-gate NMOS device formed in said semiconductor body, wherein the primary protection device and the secondary protection device share a diffusion region; and a grounded pickup region adjacent to one of the primary and the secondary protection devices;

wherein a gate of the primary protection device is longer than a gate of the secondary protection device.

2. An electrostatic discharge protection structure for a contact pad on a semiconductor substrate of a first conductivity type, comprising:

a first diffusion region of a second conductivity type in the substrate coupled to the pad;

a second diffusion region of the second conductivity type in the substrate separated from the first diffusion region by a first channel region in the substrate, so that the first and second diffusion regions form terminals of a primary protection device;

a third diffusion region of the second conductivity type in the substrate coupled to the pad and separated from the second diffusion region by a second channel region in the substrate so that the second and third diffusion regions form terminals of a secondary protection device having a breakdown voltage less than the primary protection device; and a fourth diffusion region of the first conductivity type in the substrate spaced away from the third diffusion region, and coupled to a supply reference potential.

3. The electrostatic discharge protection structure of claim 2, including a field oxide region on the surface of the substrate in the first channel region.

4. The electrostatic discharge protection structure of claim 2, including a layer of dielectric and a gate structure over the second channel region, the gate structure coupled to the supply reference potential.

5. The electrostatic discharge protection structure of claim 2, including a field oxide region on the surface of the substrate between the third and fourth diffusion regions.

6. The electrostatic discharge protection structure of claim 2, including structures in the substrate forming a silicon controlled rectifier as the primary protection device.

7. The electrostatic discharge protection structure of claim 2, wherein the first and second channel regions have respective channel lengths, and including a layer of dielectric and a gate structure over the second channel region, the gate structure coupled to the supply reference potential; and a layer of dielectric and a gate structure over the first channel region, the gate structure coupled to the supply reference potential, and wherein the channel length of the first channel region is greater than the channel length of the second channel region.

8. The electrostatic discharge protection structure of claim 2, including a field oxide region on the surface of the substrate in the first channel region;

a layer of dielectric and a gate structure over the second channel region, the gate structure coupled to the supply reference potential; and a field oxide region on the surface of the substrate between the third and fourth diffusion regions.

9. The electrostatic discharge protection device of claim 2, wherein the first conductivity type is p-type, and the second conductivity type is n-type.

10. The electrostatic discharge protection device of claim 2, wherein the supply reference potential is ground.

11. The electrostatic discharge protection device of claim 2, wherein the first, second, third, and fourth diffusion regions comprise respective elongated, essentially parallel, diffusion regions, and including a plurality of metal to diffusion contact structures in each.

* * * * *